(12) United States Patent
Hwang

(10) Patent No.: US 6,548,351 B2
(45) Date of Patent: Apr. 15, 2003

(54) METHOD FOR FABRICATING SEMICONDUCTOR CAPACITOR

(75) Inventor: Soon-Hong Hwang, Choongcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 84 days.

(21) Appl. No.: 09/767,263

(22) Filed: Jan. 23, 2001

(65) Prior Publication Data

US 2001/0010959 A1 Aug. 2, 2001

(30) Foreign Application Priority Data

Jan. 27, 2000 (KR) .......................................... 2000/3938

(51) Int. Cl.[7] .......................................... H01L 21/8242
(52) U.S. Cl. ........................ 438/255; 438/398; 438/665
(58) Field of Search ................................ 438/255, 398, 438/665, FOR 488, FOR 964

(56) References Cited

U.S. PATENT DOCUMENTS

| | | | | |
|---|---|---|---|---|
| 5,656,529 A | * | 8/1997 | Fukase | |
| 5,721,153 A | * | 2/1998 | Kim et al. | |
| 5,858,838 A | | 1/1999 | Wang et al. | ................. 438/255 |
| 5,882,410 A | * | 3/1999 | Kawahara et al. | |
| 6,033,967 A | * | 3/2000 | Li et al. | |
| 6,090,697 A | * | 7/2000 | Xing et al. | |
| 6,177,351 B1 | * | 1/2001 | Beratan et al. | |
| 6,218,242 B1 | * | 4/2001 | Tseng | |
| 6,232,177 B1 | * | 5/2001 | Chang et al. | |
| 6,242,316 B1 | * | 6/2001 | Joo | |
| 6,281,142 B1 | * | 8/2001 | Basceri et al. | |
| 6,319,769 B1 | * | 11/2001 | Cho | |
| 6,329,264 B1 | * | 12/2001 | Wu | |
| 6,358,795 B1 | * | 3/2002 | Tseng | |

* cited by examiner

Primary Examiner—Olik Chaudhuri
Assistant Examiner—Joannie Adelle Garcia
(74) Attorney, Agent, or Firm—Morgan, Lewis & Bockius LLP

(57) ABSTRACT

A method of fabricating a semiconductor capacitor is disclosed. An impurity layer is formed on a semiconductor substrate. An interlayer insulating film is disposed on an upper surface of the impurity layer and the semiconductor substrate. A contact hole is selectively etched through the interlayer insulating film to the impurity layer. A conductive plug is formed in the contact hole. A metal film pattern having an irregular surface area is disposed on the conductive plug. A dielectric substance film is located directly on the irregular surface of the metal film pattern. A metal electrode is formed on the dielectric substance film.

18 Claims, 5 Drawing Sheets

METHOD FOR FABRICATING SEMICONDUCTOR CAPACITOR

CROSS-REFERENCE TO RELATED APPLICATIONS

This application claims the benefit of Application No. 3938/2000, filed in Korea on Jan. 27, 2000, which is hereby incorporated by reference.

BACKGROUND OF THE INVENTION

1. Field of the Invention

The present invention relates to a method for fabricating a semiconductor device, and in particular to a method for fabricating a semiconductor capacitor having a lower electrode with an increased effective surface area.

2. Description of the Background Art

Competition within the semiconductor industry has led to improved performance and decreased manufacturing costs. Manufacturers are able to decrease semiconductor costs by decreasing the size of the components installed on the semiconductors, thereby allowing the installation of more components on each semiconductor device. In the case of dynamic random access memory (DRAM) semiconductor devices, manufacturers are constantly working to improve the degree of integration among the components to further reduce fabrication costs. In a conventional DRAM semiconductor device, the size of the capacitor and transistor must be decreased to lower manufacturing costs. Methods of decreasing the size of the transistor are known. However, manufacturers have been unable to effectively reduce the size of the capacitor. For these reasons, further significant improvements in the manufacturability of DRAM semiconductor device require a reduction in size of the capacitor.

Various attempts have been made to reduce the size of the capacitor. For example, capacitor electrodes have been formed in a variety of geometric shapes in an attempt to increase the size of the electrodes, including the trench-type and stacked capacitors. Manufacturers have also attempted to use dielectric substance having high dielectric constants.

FIGS. 1A–1E show an example of sequential steps during the manufacture of a conventional DRAM semiconductor device.

As shown in FIG. 1A, a gate oxide film 101 and a gate electrode 102 are formed on a semiconductor substrate 100. A source 103 and a drain 104 are formed on opposite sides of the gate oxide film 101 and electrode 102 by implanting impurity ions into the substrate 100. The gate oxide film 101, the electrode 102, the source 103, and the drain 104 form a MOS transistor 120.

Referring to FIG. 1B, an interlayer insulating film 105 is formed on an entire upper surface of the semiconductor substrate 100, including the MOS transistor 120. A contact hole 106 is formed by etching the insulating film 105 over the source 103.

A polysilicon plug 107 is formed within the contact hole 106, as illustrated in FIG. 1C. A polysilicon film is formed on the polysilicon plug 107. The polysilicon film is patterned to form a polysilicon film pattern 108. The film pattern 108 has the same electrical connection properties as the polysilicon plug 107. The polysilicon film pattern 108 is a lower electrode of a capacitor of the DRAM semiconductor device.

As shown in FIG. 1D, a hemispherical silicon grain (HSG) film 109 is formed on a surface of the polysilicon film pattern 108. The HSG film 109 increases the effective surface area of the lower electrode of the capacitor.

A dielectric film 110 is formed on a surface of the HSG film 109, as seen in FIG. 1E. An upper electrode 111 of the capacitor is then formed on the dielectric film 110. The upper electrode 111 can be made of a metal or a polysilicon film.

This method of fabricating a conventional semiconductor includes a number of disadvantages. The capacitor formed by this process is a metal-insulator-semiconductor (MIS) type capacitor having a polysilicon lower electrode and a metal upper electrode. An MIS capacitor produces an asymmetric voltage-capacitance (C–V) curve, resulting in a deterioration of the characteristics of the capacitor. Further, the step of forming the HSG film to increase the effective surface area of the lower electrode complicates the manufacturing process, since a silicon seed film must be formed on the surface of the lower electrode, and the seeded electrode must be annealed under considerably controlled conditions. It is also difficult to produce HSG films having a constant thickness. For these reasons, it is difficult to manufacture a capacitor by this conventional method having a desired capacitance.

SUMMARY OF THE INVENTION

Accordingly, the present invention discloses a method of fabricating a semiconductor capacitor having a symmetric C–V curve by providing a capacitor with a metal-insulator-metal (MIM) structure wherein both the upper and the lower electrodes of the capacitor are formed of metal.

The present invention also discloses a method of fabricating a semiconductor capacitor having a lower electrode with an increased effective surface, without using a complex HSG film formation step.

The present invention provides a method of fabricating a semiconductor capacitor including forming an impurity layer on a semiconductor substrate. An interlayer insulating film is formed on the impurity layer. A contact hole is formed on the impurity layer by selectively etching the interlayer insulating film. A conductive plug is formed in the contact hole. A metal film pattern is formed on the conductive plug. An irregularity is formed on the surface of the metal film pattern. A dielectric film is formed on the surface of the metal film pattern. A metal film or electrode is formed on the dielectric film.

Forming the irregularity on the surface of the metal film pattern can include forming a polysilicon layer on the surface of the metal film pattern. A silicide layer can be formed by a silicide reaction at an interface between the polysilicon layer and the metal film pattern. The polysilicon layer and the silicide layer can be removed.

The present invention further provides the method of fabricating the semiconductor capacitor wherein a material of the metal film pattern includes W, and the formation of the silicide layer includes annealing at a temperature of between about 600° C. and about 1300° C.

The present invention further provides the method of fabricating the semiconductor capacitor that includes annealing the metal film pattern in at least one of an $N_2$ plasma, an $NH_3$ plasma, an $N_2$ atmosphere, and an $NH_3$ atmosphere, after removal of the silicide layer.

The present invention further provides the method of fabricating the semiconductor capacitor wherein a material of the metal film pattern includes Pt, and the formation of the silicide layer includes annealing at a temperature of between about 400° C. and about 1000° C.

The present invention further provides the method of fabricating the semiconductor capacitor wherein a material of the metal film pattern includes Ti, and the formation of the silicide layer includes annealing at a temperature of between about 500° C. and about 1100° C.

The present invention further provides a method of fabricating a semiconductor capacitor having a substrate and an impurity layer on the substrate. A conductive plug is formed in contact with the impurity layer. A metal film pattern having an irregular surface is formed on the conductive plug. A dielectric substance film is formed on the metal film pattern.

The present invention further provides a semiconductor capacitor. A semiconductor substrate includes an impurity layer. A conductive plug contacts the impurity layer. A metal film pattern is disposed on the conductive plug. A dielectric substance film is installed on the metal film pattern.

BRIEF DESCRIPTION OF THE DRAWINGS

The accompanying drawings, which are incorporated herein and constitute part of this specification, illustrate preferred embodiments of the present invention, and, together with the general descriptions given above and the detailed descriptions given below, serve to explain features of the present invention.

DETAILED DESCRIPTION OF THE PREFERRED EMBODIMENTS

Figure 1A:
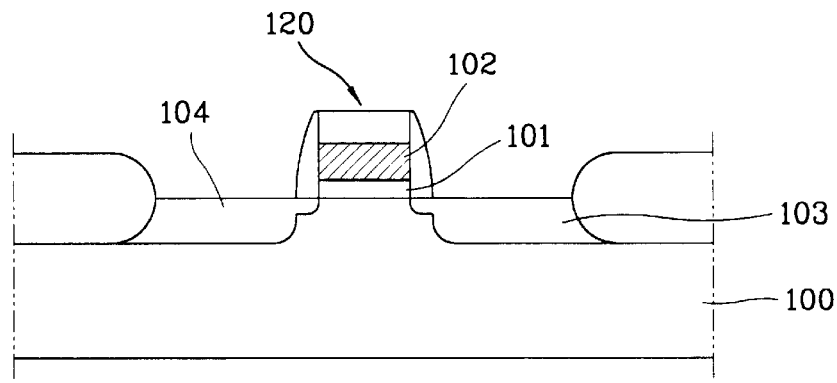
FIGS. 1A to 1E are cross-sectional views showing steps in a method of fabricating a conventional semiconductor capacitor.
Figure 1B:
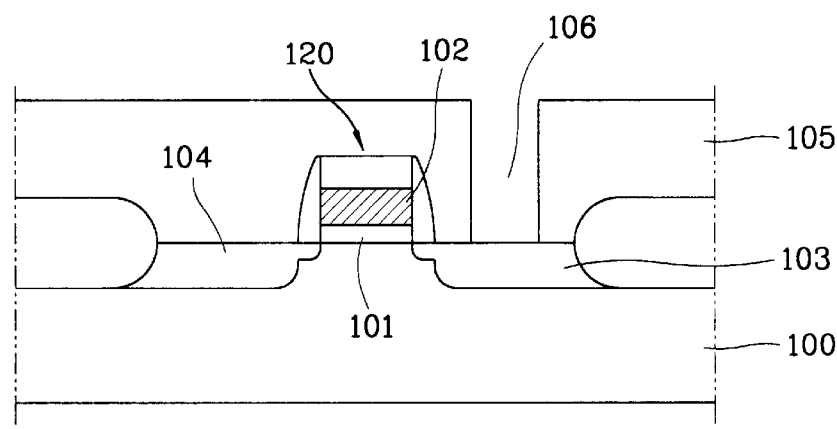
Figure 1C:
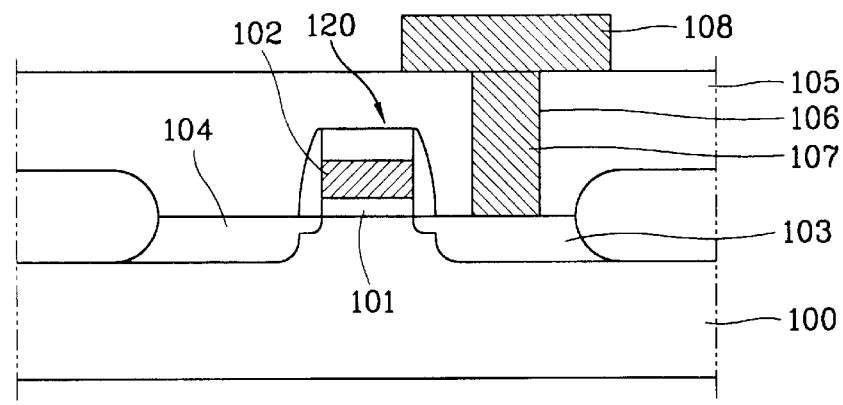
Figure 1D:
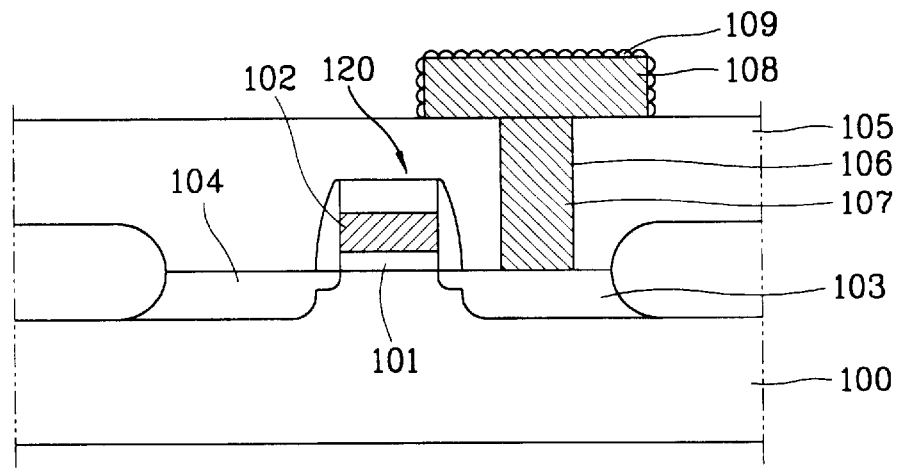
Figure 1E:
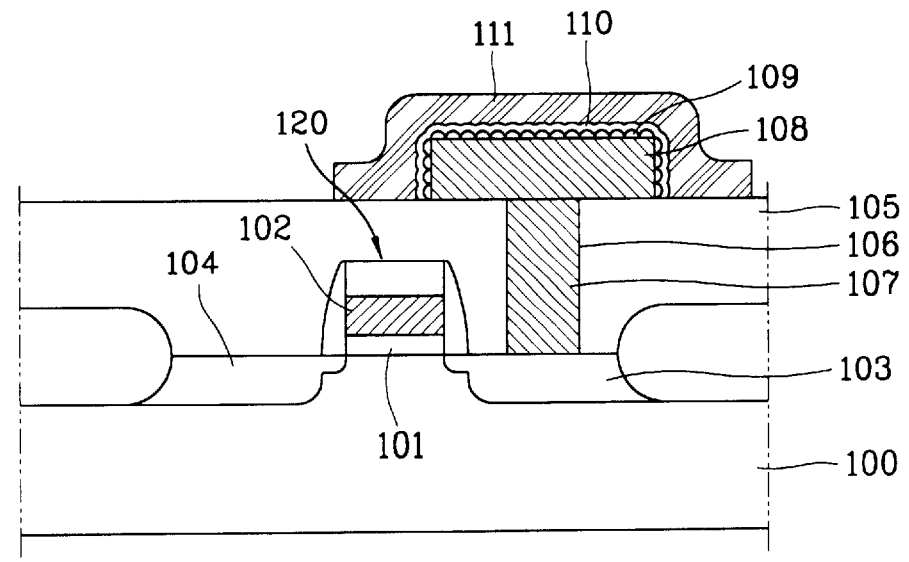

Referring to the drawings, FIGS. 2A–2G show examples of a sequential method of fabricating a semiconductor capacitor according to the present invention.

Figure 2A:
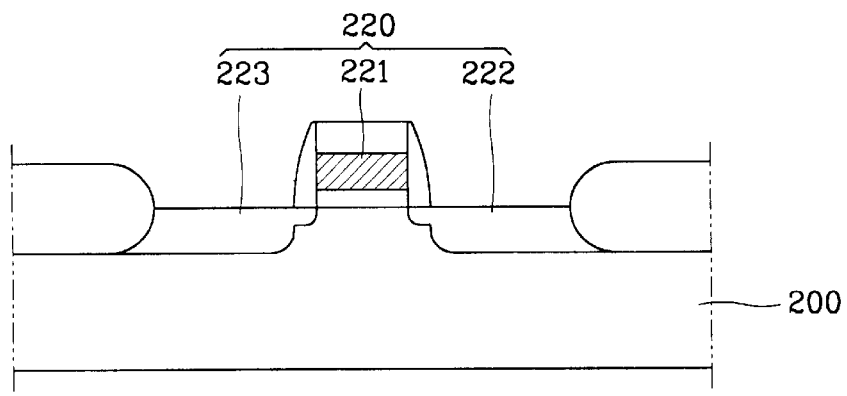
FIGS. 2A to 2G are cross-sectional views showing steps in a method of fabricating a semiconductor capacitor according to the present invention.

As shown in FIG. 2A, a gate oxide film and a gate electrode 221 are sequentially stacked on an upper surface of a semiconductor substrate 200. An impurity layer is formed by implanting impurity ions within the substrate 200. The impurity layer includes a source 222 and a drain 223, each formed on an opposite side of the film and electrode 221. The gate oxide film and electrode 221, the source 222, and the drain 223 form a MOS transistor 220.

Figure 2B:
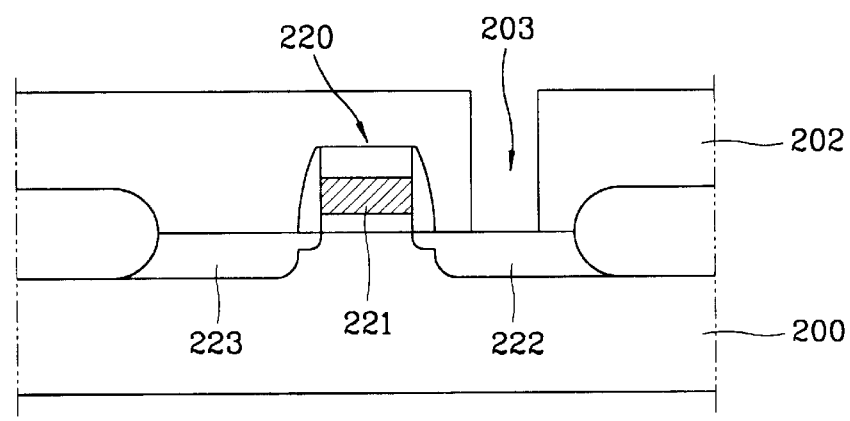

FIG. 2B illustrates an interlayer insulating film 202 disposed on the upper surface of the substrate 200 and the MOS transistor 220. The insulating film 202 is a silicon oxide film formed by chemical vapor deposition. A contact hole 203 is formed by selectively etching the insulating film 202 to expose the source 222 of the impurity layer.

Figure 2C:
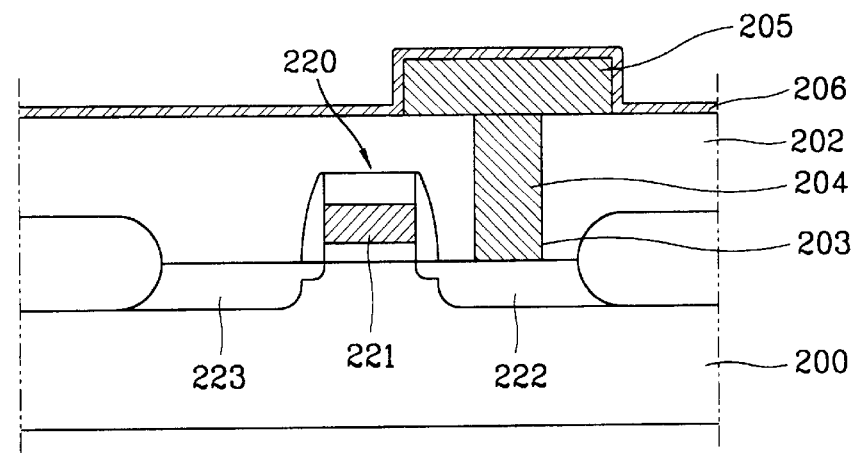

Referring to FIG. 2C, a conductive plug 204 is formed in the contact hole 203. The conductive plug 204 can be made of a material including a polysilicon doped with P, formed by low pressure chemical vapor deposition, having superior gap-filling properties. A metal film is disposed on top surface of the conductive plug 204 and the insulating film 202. The metal film can be made of a material including one or more of Ti, Zr, Co, Ni, Mo, W, Pt, Ta and Nb, and alloys thereof. The metal film is patterned to form a metal film pattern 205. A polysilicon layer 206 is formed on one or more surfaces of the metal film pattern 205 and the top surface of the insulating film 202. The polysilicon layer 206 can have a thickness that is greater than about 10 Å.

Figure 2D:
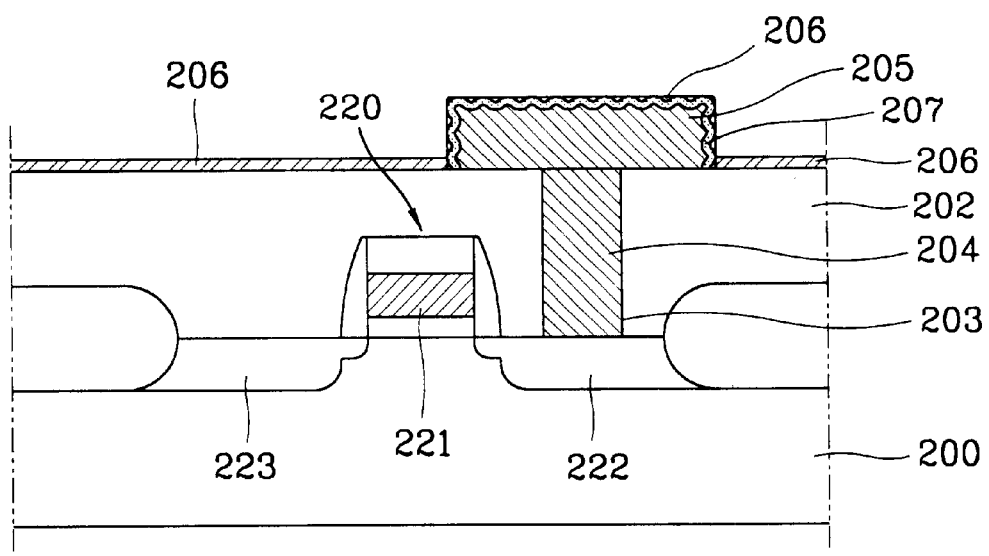

The metal film pattern 205 and the polysilicon layer 206 are annealed under appropriate conditions to cause a suicide reaction. As shown in FIG. 2D, a silicide layer 207 is formed at an interface between the polysilicon layer 206 and the metal film pattern 205 as a result of the silicide reaction. The suicide reaction causes a surface of the metal film pattern 205 in contact with the silicide layer 207 to become uneven or irregular.

The conditions under which a silicide reaction will occur, and hence under which annealing will take place, are determined at least in part by the material of the metal film pattern 205. A metal film pattern manufactured from W requires that annealing be performed at a temperature of between about 600 and about 1300° C. to form a tungsten silicide layer 207. A metal film pattern constructed from Pt requires annealing at a temperature of between about 400 and about 1000° C., forming a silicide layer of platinum silicide. A metal film pattern constructed from Ti requires annealing at a temperature of between about 500° C. and about 1100° C. to form the titanium silicide layer 207.

Figure 2E:
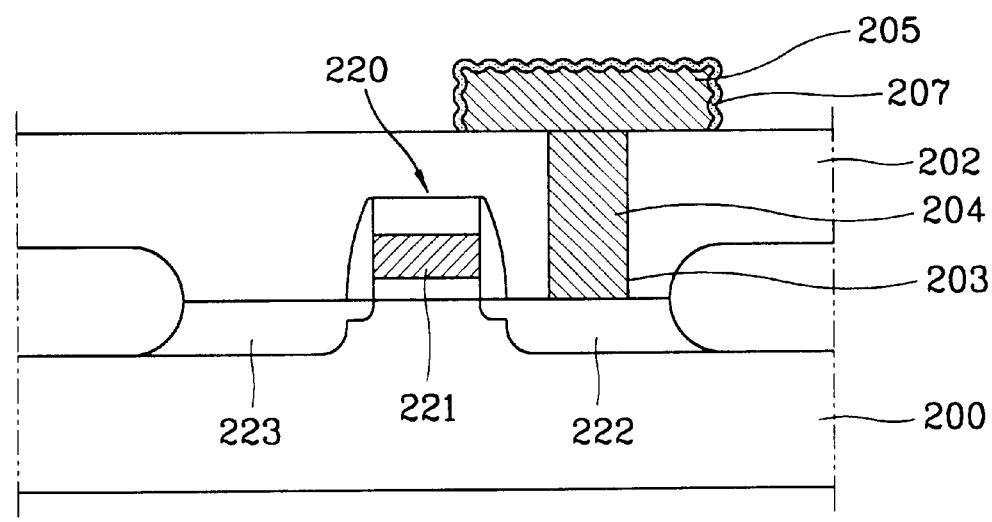

Referring to FIG. 2E, the residual, unreacted polysilicon layer 206 is removed by selective etching process.

Figure 2F:
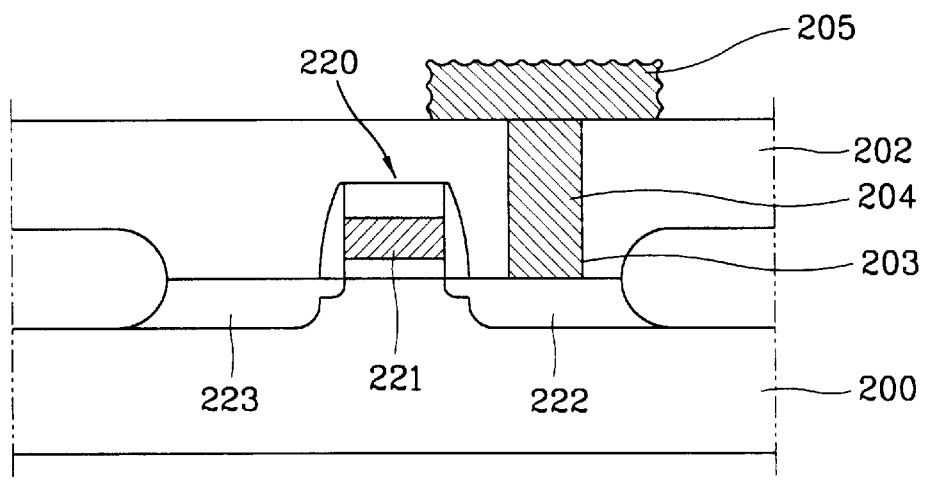

As shown in FIG. 2F, the silicide layer 207 is removed by etching process. Removal of the silicide layer 207 exposes the uneven and irregular surface of the metal film pattern 205. It is well understood that an area of this irregular surface is greater than the surface area of the metal film pattern 205 before annealing.

Depending on the material, the irregularly surfaced metal film pattern 205 can be further annealed. An irregularly surfaced metal film pattern manufactured from W or Ti can be further annealed in one or more of an $N_2$ plasma, an $NH_3$ plasma, an $N_2$ atmosphere, and an $NH_3$ atmosphere. Annealing of an irregularly surfaced metal film pattern formed from W results in the formation of WN, while annealing a Ti pattern forms TiN. Annealing of the irregularly surfaced metal film pattern 205 prevents oxidation during subsequent deposition process of a dielectric substance, thereby preventing deterioration of the capacitor characteristics.

Figure 2G:
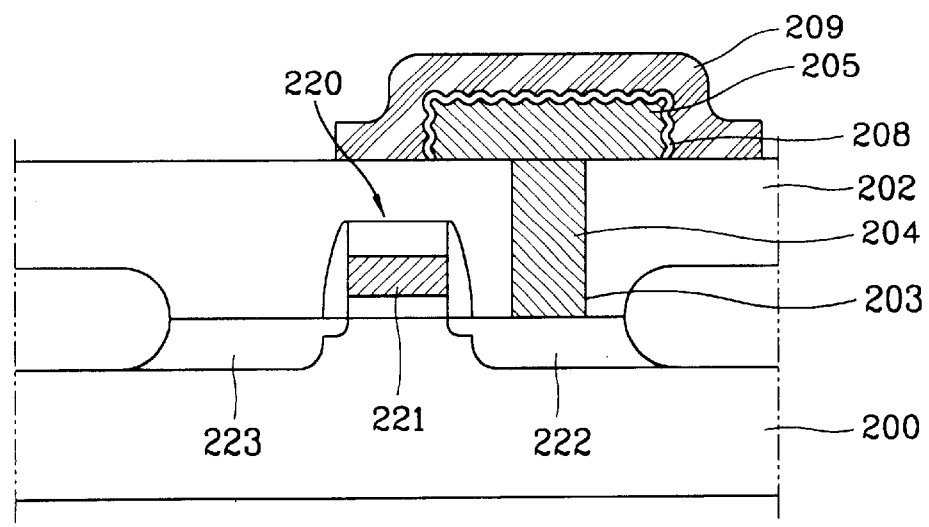

A dielectric substance film 208 is formed on the irregularly surfaced metal film pattern 205, as illustrated in FIG. 2G. The dielectric substance film 208 can be made of a material including one or more ferroelectric substances including NO,)Ba,Sr) $TiO_3$ and $Pb(Zr,Ti)O_3$. A metal electrode 209 is disposed on the dielectric substance film 208. The metal electrode 209 can be made of a material including one or more of W, Al, Mo, Pt, Ru, Ir, $RuO_2$, Os, Rh, pd and alloys thereof.

It is understood that a semiconductor manufactured according to the present invention has a desired MIM structure that results in a symmetrical C–V curve, providing superior electrical properties. Additionally, the effective surface area of the lower electrode of the semiconductor can be easily increased through the formation and removal of the silicide layer.

While the present invention has been disclosed with reference to certain preferred embodiments, numerous modifications, alterations, and changes to the described embodiments are possible without departing from the sphere and scope of the present invention, as defined in the appended claims. Accordingly, it is intended that the present invention not be limited to the described embodiments, but that it have the full scope defined by the language of the following claims, and equivalents thereof

What is claimed is:

1. A method of fabricating a semiconductor capacitor, comprising:

forming an impurity layer on a semiconductor substrate;

forming an interlayer insulating film on an upper surface of the impurity layer and the semiconductor substrate;

forming a contact hole through the interlayer insulating film to the impurity layer;

forming a conductive plug in the contact hole;

forming a metal film pattern on the conductive plug;

forming an irregular surface on the metal film pattern subsequent to forming the metal film pattern;

forming a dielectric substance film on the irregular surface on the metal film patter; and forming a metal electrode on the dielectric substance film.

2. The method according to claim 1, wherein a material of the metal film pattern comprises one of Ti, Zr, Co, Ni, Mo, W, Pt, Ta, Nb, WN and TiN.

3. A method of fabricating a semiconductor capacitor, comprising:

forming an impurity layer on a semiconductor substrate;

forming an interlayer insulating film on an upper surface of the impurity layer and the semiconductor substrate;

forming a contact hole through the interlayer insulating film to the impurity layer;

forming a conductive plug in the contact hole;

forming a metal film pattern on the conductive plug;

forming an irregular surface on the metal film pattern;

forming a dielectric substance film on the irregular surface on the metal film pattern; and forming a metal electrode on the dielectric substance film wherein forming the irregular surface on the metal film pattern further comprises;

forming a polysilicon layer on the surface of the metal film pattern;

forming a silicide layer by a silicide reaction at an interface between the polysilicon layer and the metal film pattern;

removing the polysilicon layer; and removing the silicide layer.

4. The method according to claim 3, wherein a thickness of the polysilicon layer is greater than about 10 Å.

5. The method according to claim 4, wherein a material of the metal film pattern comprises W.

6. The method according to claim 5, wherein forming the silicide layer comprises annealing at a temperature of between about 600° C. and about 1300° C.

7. The method according to claim 6, further comprising:

annealing the metal film pattern in one of an $N_2$ plasma, an $NH_3$ plasma, an $N_2$ atmosphere and an $NH_3$ atmosphere, after removing the silicide layer.

8. The method according to claim 4, wherein a material of the metal film pattern comprises Pt.

9. The method according to claim 8, wherein forming the silicide layer comprises annealing at a temperature of between about 400° C. and about 1000° C.

10. The method according to claim 4, wherein a material of the metal film pattern comprises Ti.

11. The method according to claim 10, wherein forming the silicide layer comprises annealing at a temperature of between about 500° C. and about 1100° C.

12. The method according to claim 11, further comprising:

annealing the metal film pattern in one of an $N_2$ plasma, an $NH_3$ plasma, an $N_2$ atmosphere, and an $NH_3$ atmosphere, after removing the silicide layer.

13. The method according to claim 1, wherein a material of the dielectric substance film comprises NO.

14. The method according to claim 1, wherein a material of the dielectric substance film comprises a ferroelectric substance.

15. The method according to claim 14, wherein the ferroelectric substance comprises one of NO, $BaTiO_3$, $SrTiO_3$, $PbZrO_3$, and $PbTiO_3$.

16. The method according to claim 1, wherein a material of the metal electrode comprises one of W, Al, Mo, Pt, Ru, Ir, $RuO_2$, $IrO_2$, Os, Rh, and Pd.

17. A method of fabricating a semiconductor capacitor having a substrate and an impurity layer on the substrate, the method comprising:

forming a conductive plug in contact with the impurity layer;

forming a metal film pattern on the conductive plug, the metal film pattern having an irregular surface that is formed subsequent to forming the metal film pattern; and forming a dielectric substance film on the metal film pattern.

18. The method according to claim 17, further comprising:

forming a metal electrode of the dielectric substance film.

* * * * *